United States Patent
Son et al.

(10) Patent No.: US 9,711,205 B2
(45) Date of Patent: Jul. 18, 2017

(54) METHOD OF USE TIME MANAGEMENT FOR SEMICONDUCTOR DEVICE AND SEMICONDUCTOR DEVICE INCLUDING USE TIME MANAGING CIRCUIT

(71) Applicant: Samsung Electronics Co., Ltd., Suwon-si (KR)

(72) Inventors: Jong-Pil Son, Seongnam-si (KR); Chul-Woo Park, Yongin-si (KR); Young-Soo Sohn, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/874,568

(22) Filed: Oct. 5, 2015

(65) Prior Publication Data

US 2016/0104522 A1    Apr. 14, 2016

(30) Foreign Application Priority Data

Oct. 13, 2014    (KR) .................. 10-2014-0137564

(51) Int. Cl.
| | | |
|---|---|---|
| *G11C 11/406* | (2006.01) | |
| *G06F 12/02* | (2006.01) | |
| *G11C 11/00* | (2006.01) | |
| *G11C 29/28* | (2006.01) | |
| *G11C 29/04* | (2006.01) | |
| *G11C 29/44* | (2006.01) | |

(52) U.S. Cl.
CPC .... *G11C 11/40615* (2013.01); *G06F 12/0246* (2013.01); *G11C 11/005* (2013.01); *G11C 29/28* (2013.01); *G06F 2212/7201* (2013.01); *G11C 2029/0409* (2013.01); *G11C 2029/4402* (2013.01); *G11C 2211/4061* (2013.01)

(58) Field of Classification Search
CPC .................................................. G11C 16/349
USPC ...................................................... 711/154
See application file for complete search history.

(56) References Cited

U.S. PATENT DOCUMENTS

| | | | |
|---|---|---|---|
| 6,972,585 B2 | 12/2005 | Ito et al. | |
| 8,339,889 B2 | 12/2012 | Cho | |
| 2007/0277016 A1* | 11/2007 | Risse | G06F 12/1433 711/170 |

(Continued)

FOREIGN PATENT DOCUMENTS

| | | |
|---|---|---|
| JP | 2000-322811 A | 11/2000 |
| JP | 2001-266593 A | 9/2001 |

(Continued)

*Primary Examiner* — Min Huang
(74) *Attorney, Agent, or Firm* — Muir Patent Law, PLLC

(57) ABSTRACT

A use time managing method of a semiconductor device may include (1) measuring an amount of accumulated operation time of the semiconductor device and when the amount is reached to a predetermined value, generating a unit storage activation signal; (2) repeating step (1) to generate one or more additional unit storage activation signals, thereby generating a plurality of unit storage activation signals, wherein the predetermined values are different for each repeating step; (3) storing data indicating each occurrence of generating the unit storage activation signals; and (4) detecting use time of the semiconductor device based on the cumulatively stored data.

16 Claims, 22 Drawing Sheets

(56) References Cited

U.S. PATENT DOCUMENTS

| | | | |
|---|---|---|---|
| 2010/0228917 A1* | 9/2010 | Ikeuchi | G06F 3/0611 711/118 |
| 2012/0066451 A1* | 3/2012 | Fujihara | G06F 11/1076 711/114 |
| 2012/0144145 A1* | 6/2012 | Shin | G11C 16/349 711/166 |
| 2012/0170435 A1* | 7/2012 | Trantham | G11B 27/36 369/53.42 |
| 2012/0239858 A1* | 9/2012 | Melik-Martirosian | G06F 11/076 711/103 |
| 2012/0257453 A1* | 10/2012 | Shiino | G11C 16/26 365/185.18 |
| 2013/0044553 A1* | 2/2013 | Kwean | G11C 29/023 365/194 |

FOREIGN PATENT DOCUMENTS

| | | |
|---|---|---|
| JP | 2003-098233 A | 4/2003 |
| JP | 2005-166149 A | 6/2005 |
| JP | 2010-117990 A | 5/2010 |
| KR | 10-0145218 B1 | 4/1998 |
| KR | 10-2003-0081627 A | 10/2003 |
| KR | 10-2009-0006582 A | 1/2009 |

* cited by examiner

METHOD OF USE TIME MANAGEMENT FOR SEMICONDUCTOR DEVICE AND SEMICONDUCTOR DEVICE INCLUDING USE TIME MANAGING CIRCUIT

CROSS-REFERENCE TO RELATED APPLICATIONS

This US non-provisional patent application claims priority under 35 USC §119 to Korean Patent Application No. 10-2014-0137564, filed on Oct. 13, 2014, the disclosure of which is incorporated by reference in its entirety herein.

BACKGROUND

Technical Field

The present disclosure relates to semiconductor devices and, more particularly, to use time management in a semiconductor device such as a semiconductor memory device.

Discussion of Related Art

Electronic devices that are almost essential now in the modern society open include a semiconductor device such as a processor or a memory. A data processing system including a processor may use a main memory such as a dynamic random access memory (hereinafter referred to as "DRAM") as a working memory. A plurality of DRAMs may be mounted on a module substrate to constitute a DRAM module. A memory controller may receive a request from a processor to control the DRAM module.

A DRAM may include a plurality of memory cells each including a single access transistor and a single storage capacitor. When it is difficult for a certain memory cell to properly retain stored data, the memory cell may be called a defective memory cell.

With the passage of use time, memory cells may turn into soft-failed cells to cause a read error occasionally.

Moreover, with the passage of use time, intellectual properties (IPs) of each circuit in a DRAM may also deviate from a set operation to be degraded.

SUMMARY

The present disclosure provides a method of use time management of a semiconductor device and a semiconductor device including a use time managing circuit.

According to example embodiments, a use time managing method of a semiconductor device may include (1) measuring a predetermined amount of accumulated operation time of the semiconductor device and when the predetermined amount is reached, generating a unit storage activation signal; (2) repeating step (1) to generate one or more additional unit storage activation signals, thereby generating a plurality of unit storage activation signals; (3) storing data indicating each occurrence of the generated unit storage activation signals; and (4) reading the cumulatively stored data to detect use time of the semiconductor device.

In example embodiments, the use time managing method may further include generating adjusting information when the detected use time reaches a reference time value, and adjusting an operation for an internal circuit of the semiconductor device based on the adjusting information.

In example embodiments, the unit storage activation signal may be generated by counting a number of refresh commands.

In example embodiments, the data indicating use time of the semiconductor device may be cumulatively stored by programming an antifuse.

According to example embodiments, a use time managing method of a semiconductor device may include monitoring accumulated operation time of the semiconductor device by nonvolatilely updating cumulative use time of the semiconductor device in units of preset time periods during an operation of the semiconductor device; reading the cumulative use time of the semiconductor device to check whether the cumulative use time has reached a reference time value; generating adjusting information when the cumulative use time reaches the reference time value; and adjusting an operation of an internal circuit of the semiconductor device based on the adjusting information.

In example embodiments, the cumulative use time may be obtained by dividing a clock signal, the clock signal being generated by a clock generator of the semiconductor device.

In example embodiments, cumulatively storing the use time of the semiconductor device may be performed by programming an e-fuse or a flash memory cell.

In example embodiments, the cumulative use time may be obtained by counting a number of auto-refresh commands and self-refresh commands.

In example embodiments, operation parameters of an internal circuit of the semiconductor device may be tuned when the adjusting information is applied to the internal circuit.

According to example embodiments, the semiconductor device may include a use time managing circuit. The use time managing circuit may include a measuring circuit configured to measure accumulated operation time of the semiconductor device by generating a plurality of storage activation signals, each corresponding to a predetermined amount of operation time of the semiconductor device; a storage circuit configured to cumulatively store data indicating occurrences of the generated storage activation signals; and a read circuit configured to read the cumulatively stored data such that use time of the semiconductor device is detected.

In example embodiments, the use time managing part may be located inside the semiconductor device.

In example embodiments, the use time managing part may be located outside the semiconductor device.

In example embodiments, the plurality of storage activation signals are generated by a frequency divider configured to divide a clock signal generated by a clock generator of the semiconductor device or by a counter configured to count a number of refresh commands.

In example embodiments, the semiconductor device includes a control circuit configured to generate adjusting information when the detected use time reaches a reference time value.

As described above, use time of a semiconductor device may be monitored after the operation of the semiconductor device starts. Thus, a field error of the semiconductor device may be predicted or occurrence of the field error may be minimized or prevented.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain principles of the disclosure. In the drawings.

DETAILED DESCRIPTION OF THE EMBODIMENTS

Figure 1:
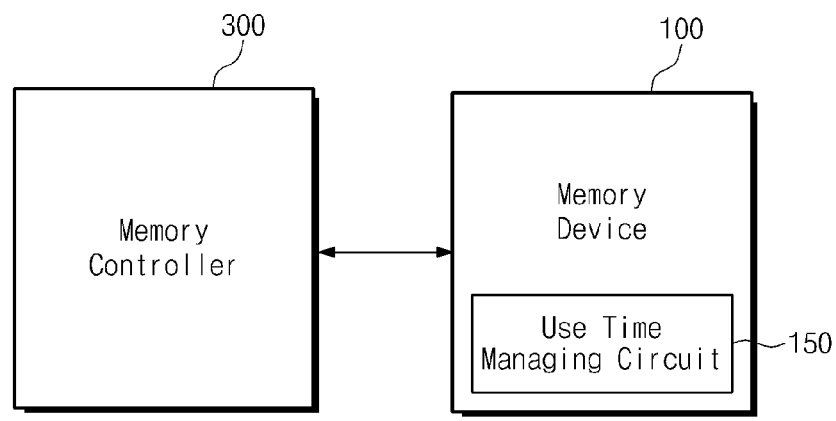
FIG. 1 is block diagram of a data processing system including a semiconductor device according to an exemplary embodiment.

Example embodiments of the present disclosure will now be described more fully through the following exemplary embodiments related to the accompanying drawings. However, the disclosure is not limited to the following embodiments but may be embodied in other forms.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third etc. may be used herein to describe various members, regions, layers, portions, and/or elements, these members, regions, layers, portions, and/or elements should not be limited by these terms. Unless indicated otherwise, these terms are used to distinguish one member, region, portion, or element from another member, region, portion, or element. Thus, a first member, region, portion, or element discussed below could be termed a second member, region, portion, or element without departing from the teachings of exemplary embodiments. For example, a first element could be termed a second element, and, similarly, a second element could be termed a first element, without departing from the scope of exemplary embodiments.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms such as "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Moreover, the same or like reference numerals in each of the drawings represent the same or like components if possible. In some drawings, the connection of elements and lines is just represented to effectively explain technical content and may further include other elements or circuit blocks.

Note that each embodiment that is herein explained and exemplified may also include its complementary embodiment and the details of basic data access operations to a DRAM or a memory module and internal function circuits and the details of a module structure and a structure or shape of a module tab area not described in order not to make the subject matter of the disclosure ambiguous.

FIG. 1 is block diagram of a data processing system including a semiconductor device according to an exemplary embodiment. As illustrated, the data processing system includes a memory controller 300. The memory controller 300 may receive a command from a host (not shown) such as a processor. The data processing system may further include a semiconductor device, e.g., a memory device 100. The memory device 100 may be a DRAM but is not limited thereto.

In embodiments of the inventive concept, the memory device 100 includes a use time managing circuit 150.

Figure 2:
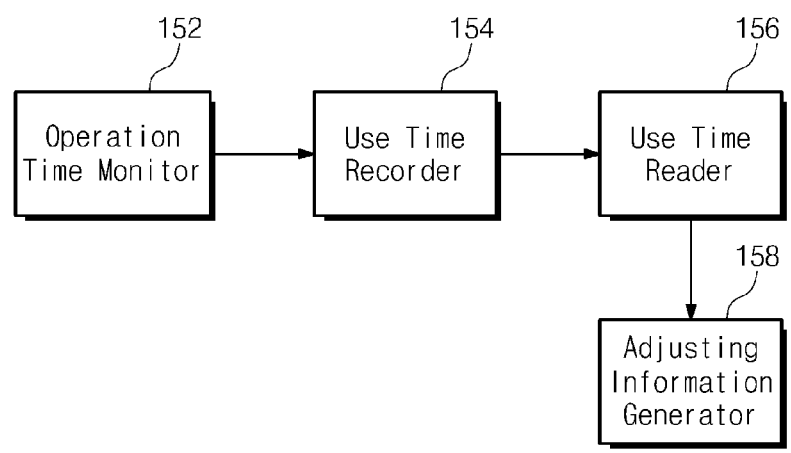
FIG. 2 is an exemplary detailed block diagram of a use time managing circuit in FIG. 1 according to certain embodiments.

In one embodiment, the use time managing circuit 150 may have the configuration as shown in FIG. 2 to measure an amount of accumulated operation time of the memory device 100 and manage use time of the memory device 100.

FIG. 2 is an exemplary detailed block diagram of the use time managing circuit 150 in FIG. 1 according to certain embodiments. As illustrated, the use time managing circuit 150 may include an operation time monitor (e.g., a measuring circuit) 152, a use time recorder (e.g., a storage circuit) 154, a use time reader (e.g., a read circuit) 156, and an adjusting information generator 158.

Figure 3:
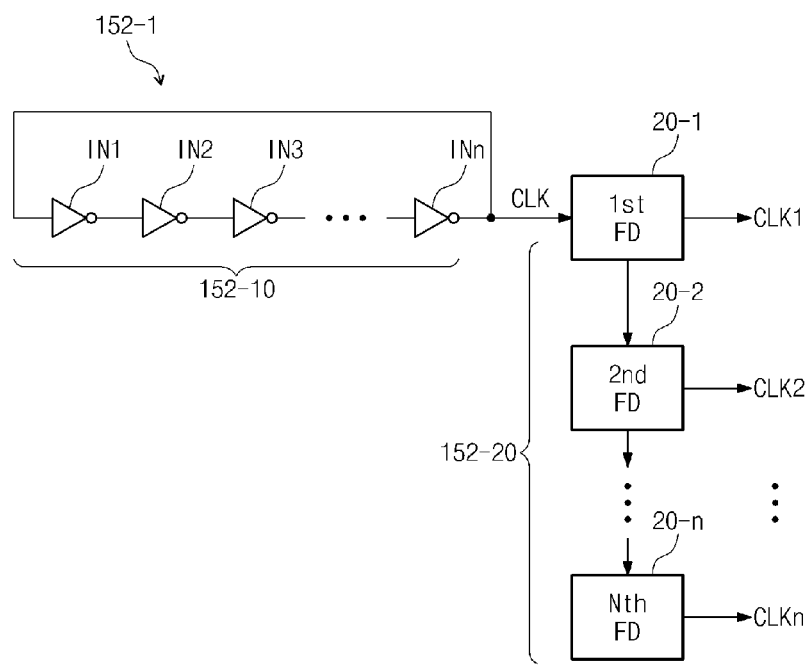
FIG. 3 is an exemplary diagram of implementing an operation time monitor in FIG. 2 according to one embodiment.

The operation time monitor 152 may include a measuring signal generator, for example as shown in FIG. 3, to measure a predetermined amount of accumulated operation time, and when the predetermined amount is reached, to generate a storage activation signal. The measuring signal generator may repeat measuring the predetermined amount of accumulated operation time to generate one or more additional storage activation signals, thereby generating a plurality of storage activation signals.

The use time recorder 154 may be implemented as a nonvolatile storage circuit, for example, an e-fuse, an anti-fuse or a nonvolatile semiconductor memory cell (e.g., NAND memory cell, NOR memory cell, RRAM memory cell, MRAM memory cell, PRAM memory cell etc.) to store data indicating each occurrence of the generated storage activation signals.

The use time reader 156 may read the cumulatively stored data in the use time recorder 154 to detect use time of the memory device 100. In one embodiment, the data indicating use time of the memory device 100 may transfer through one or more input/output pads (e.g., DQ pads) or one or more separate pads.

In one embodiment, when the use time reaches a reference time value, adjusting information may be generated from the adjusting information generator 158 to adjust an operation for an internal circuit of the memory device 100 based on the adjusting information.

The use time reader 156 and the adjusting information generator 158 may be implemented, for example, by a control circuit of the memory device 100.

FIG. 3 is an exemplary diagram of implementing the operation time monitor 152 in FIG. 2 according to one embodiment. As illustrated, the operating time monitor 152 may include a measuring signal generator 152-1 including an oscillator 152-10 and a frequency divider 152-20.

The oscillator 152-10 may be implemented with a plurality of inverters IN1, IN2, . . . , and INn connected in a cascade fashion. The frequency divider circuit 152-20 may be implemented with a plurality of frequency dividers 20-1, 20-2, . . . , and 20-n connected in a cascade fashion.

A selected one of clock signals generated by the measuring signal generator 152-1 may function as a unit storage activation signal. In one embodiment, the unit storage activation signal may be used to measure use time of the memory device 100.

In one embodiment, if an output clock signal CLK2 of a second frequency divider 20-2 is selected as a unit storage activation signal, accumulated operation time of the memory device 100 is monitored in each period of the output clock signal CLK2.

In one embodiment, if an output clock signal CLK1 of a first frequency divider 20-1 is selected as a unit storage activation signal, the accumulated operation time of the memory device 100 is monitored in each period of the output clock signal CLK1.

In one embodiment, if an output clock signal CLKn of an nth frequency divider 20-n is selected as a unit storage activation signal, the accumulated operation time of the memory device 100 is monitored in each period of the output clock signal CLKn.

Figure 4:
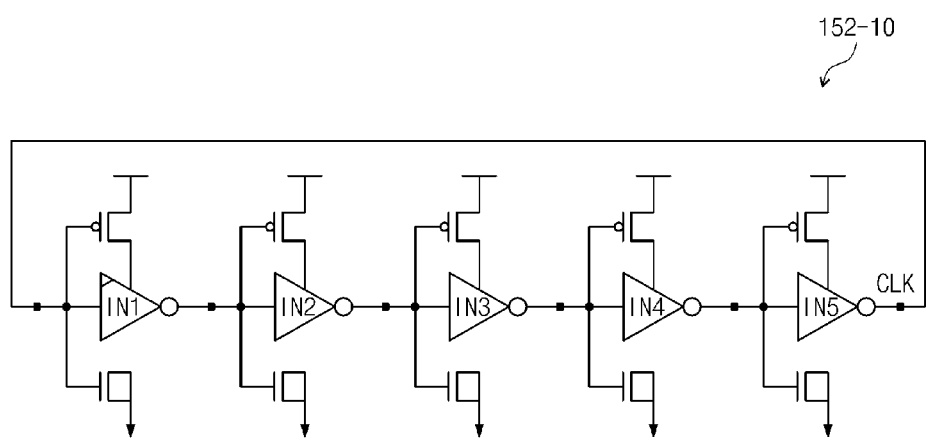
FIG. 4 is an exemplary detailed circuit diagram of an oscillator in FIG. 3 according to one embodiment.

FIG. 4 is an exemplary detailed circuit diagram of the oscillator 152-10 in FIG. 3 according to one embodiment. As illustrated, the oscillator 152-10 is a ring-type oscillator including 5-stage inverters IN1 to IN5 connected in a cascade fashion. A clock signal CLK output from an output terminal of the oscillator 152-10 is fed back to an input terminal of the first inverter IN1 while being applied as an input of the frequency 20-1 in FIG. 3.

Figure 5:
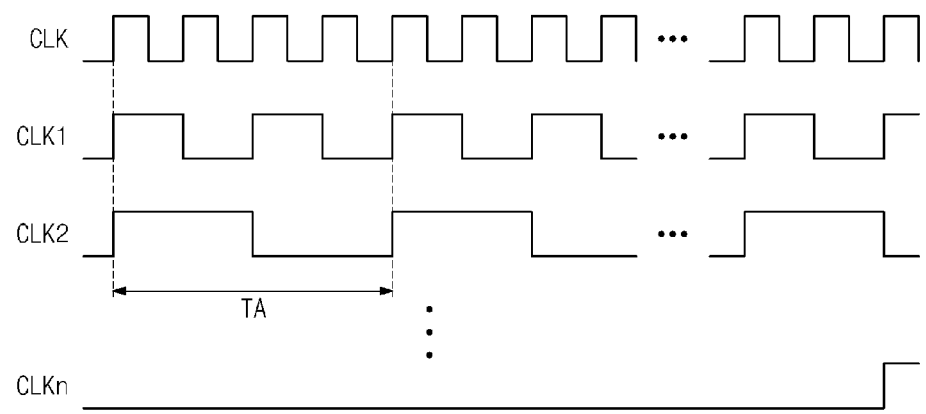
FIG. 5 is an exemplary timing diagram associated with FIG. 3 according to one embodiment.

FIG. 5 is an exemplary timing diagram associated with FIG. 3 according to one embodiment.

Referring to FIG. 3, a clock signal CLK may be generated from the oscillator 152-10 in FIG. 3. The output clock signal CLK1 may be generated from the first frequency divider 20-1 in FIG. 3. For example, a clock period of the output clock signal CLK1 may be two times a clock period of the clock signal CLK.

The output clock signal CLK2 may be generated from the second frequency divider 20-2 in FIG. 3. The output clock signal CLK2 may be generated by two-dividing the output clock signal CLK1. A time interval TA of the output clock signal CLK2 may correspond to four periods of the clock signal CLK. For example, if the output clock signal CLK2 is selected as the storage activation signal the predetermined amount of accumulated operation time of the semiconductor device may be a time corresponding to four clocks.

An output clock signal CLKn may be generated from an $n^{th}$ frequency divider 20-n in FIG. 3. For example, if the output clock signal CLKn is selected as the storage activation signal the predetermined amount of accumulated operation time of the semiconductor device may be a time corresponding to $2^n$ clocks, wherein n is a natural number greater than 2.

Figure 6:
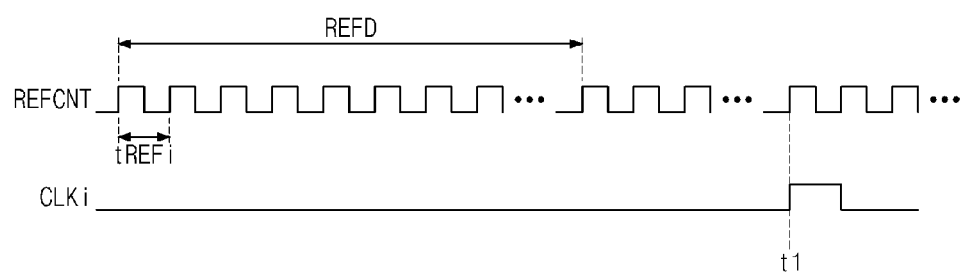
FIG. 6 is an exemplary timing diagram of the operation time monitor in FIG. 2 according to one embodiment.

FIG. 6 is an exemplary timing diagram of the operation time monitor in FIG. 2 according to one embodiment. FIG. 6 shows example timings illustrating an update signal by counting a refresh command signal generated in a refresh period.

A waveform REFCNT may indicate a refresh command signal. The refresh command signal may include a plurality of refresh commands. A period REFD shown in the waveform REFCNT may correspond to a particular amount of time (e.g., 64 milliseconds (ms)) that is a refresh period. If an interval tREFi of the refresh signal is 1 ms, 64 countings occur in the refresh period REFD. An update signal CLKi may be generated at a time point t1 by counting a number of refresh commands included in the refresh command signal. In one embodiment, a clock pulse CLKi generated at the time point t1 may function as the unit storage activation signal. For example, if a number of the refresh commands are 8 Giga at the t1 the predetermined amount of accumulated operation time is a time corresponding to 8 Giga commands.

In one embodiment, the update signal CLKi may be generated by counting a number of auto-refresh commands and self-refresh commands. For example, a refresh command signal REFCNT may be generated periodically at a predetermined interval of time (e.g., 7.8 us or 15.6 us) in an auto-refresh mode of the memory device. Also, a refresh command signal may be generated periodically at a predetermined interval of time (the interval is the same as that of the auto-refresh mode or different) in a self-refresh mode of the memory device.

As a result, the unit storage activation signal in FIG. 5 may be generated even through FIG. 6.

Figure 7:
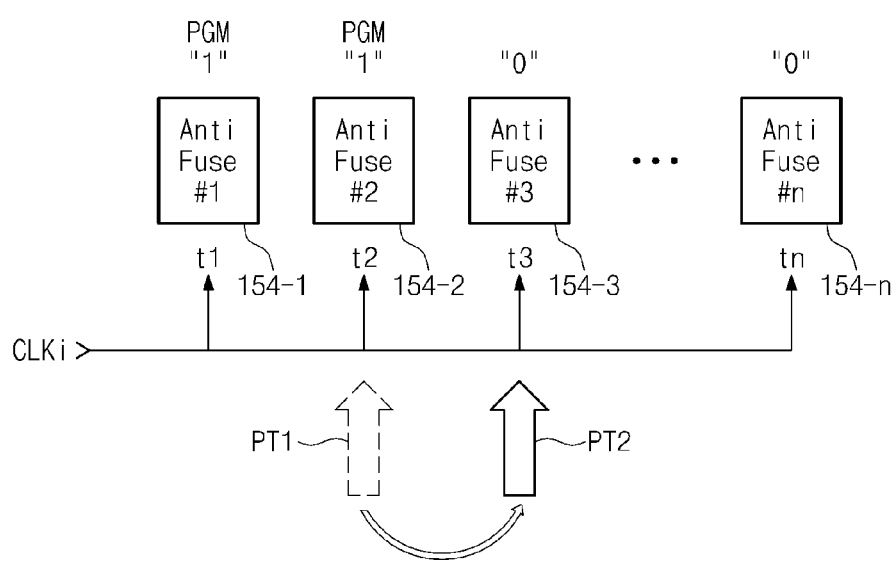
FIG. 7 illustrates the principle of updating use time in a use time recorder of FIG. 2 according to one embodiment.

FIG. 7 illustrates the principle of updating use time in a use time recorder of FIG. 2 according to one embodiment. Referring to FIG. 7, the use time recorder 154 may be implemented using a nonvolatile storage circuit. The nonvolatile storage circuit may comprise an e-fuse, an antifuse or a transistor such as a flash memory cell.

An example of the use time recorder 154 including an antifuse array including antifuses 154-1, 154-2, 154-3, . . . , and 154-n is shown in FIG. 7.

An antifuse is fuse-programmed when it is applied with a high current or a high voltage.

Each antifuse may be used as an individual component to store data indicating each occurrence of the generated unit storage activation signals.

In general, an antifuse is a resistance fuse component. The antifuse has a high resistance (e.g., 100 MΩ) when it is not programmed and has a low resistance (e.g., 100 KΩ) after it is programmed. The antifuse may include a very thin dielectric material of several angstroms (Å) to several hundreds of angstroms (Å) such as composite of a dielectric substance such as silicon dioxide ($SiO_2$), silicon nitride, tantalum oxide or silicon dioxide-silicon nitride-silicon dioxide (ONO) is interposed between two conductive materials.

A program operation of the antifuse is performed by applying a high voltage (e.g., 10V) through antifuses for a sufficiently long time to rupture the dielectric substance between two conductive materials. When the antifuse is programmed, conductive materials of both ends of the antifuse are shorted to make the resistance through the antifuse become lower than that of a pre-programmed state. Thus, an initial state of the antifuse is electrically 'open' state and the antifuse enters an electrically 'shorted' state after being programmed by the high voltage (e.g., 10V).

Each time the unit storage activation signal CLKi of FIG. 6 is generated, a corresponding antifuse may be programmed for updating use time of the memory device 100. In case of FIG. 7, as the unit storage activation signal CLKi is generated twice, a first antifuse 154-1 and a second antifuse 154-2 are programmed to "1". When the unit storage activation signal CLKi is generated at a time point t3, a program pointer PT may indicate a current program pointer PT2 from a previous program pointer PT1. Thus, a third antifuse 154-3 may be programmed to "1" from "0".

Similar to the principle of a read operation for a memory cell array, data stored in a programmed antifuse array may be read by a control circuit in a memory device 100. For example, the control circuit may select an antifuse using a row decoder and a column decoder to read stored use time information through a read circuit such as a sense amplifier.

As a result, cumulatively stored use time of the memory device may be compared with a reference time value when the data corresponding to use time is read by reading data stored in the antifuse array. If the cumulative use time is determined to reach the reference time value, the control circuit may generate adjusting information to adjust an operation for an internal circuit of the semiconductor device 100.

For example, a voltage level (e.g., a DC voltage) may vary when the adjusting information is applied to the internal circuit of the memory device 100. In addition, time delay of internal signals may vary when the adjusting information is applied to the internal circuit. In addition, driving capability of drivers may vary when the adjusting information is applied to the internal circuit. Moreover, sensing capability of a sense amplifier may vary when the adjusting information is applied to the internal operation circuit.

As a memory device, the semiconductor device may be a dynamic random access memory (DRAM) including a plurality of memory cells each including a single access transistor and a single storage capacitor.

Examples of use time management will now be described below with reference to FIGS. 8A and 8B.

Figure 8A:
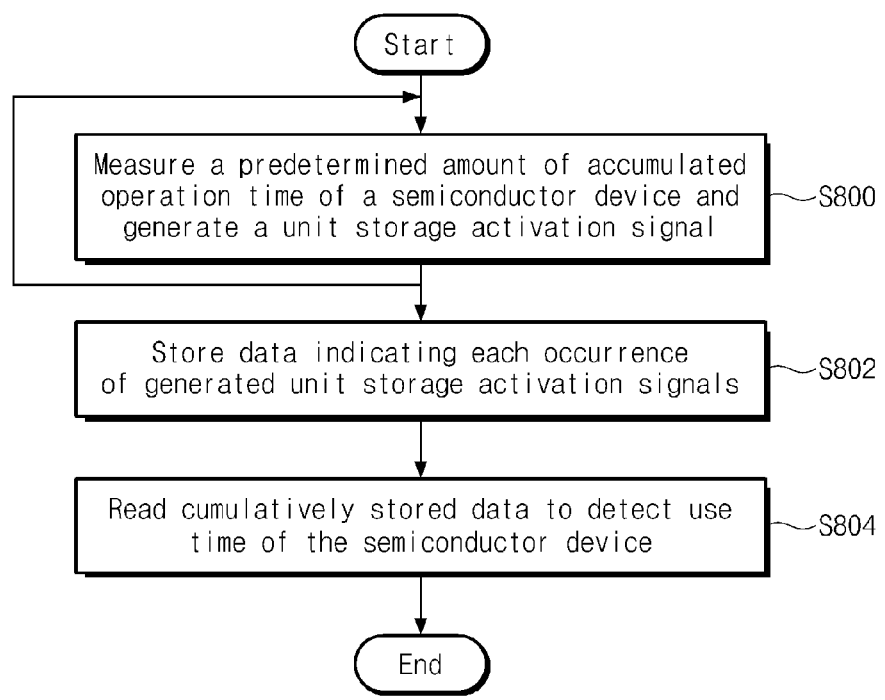
FIGS. 8A and 8B are flowcharts summarizing use time management according to FIG. 2 according to example embodiments.

FIG. 8A is a flowchart summarizing use time management according to FIG. 2 according to example embodiments.

During the operation of a semiconductor device, a predetermined amount of accumulated operation time of the semiconductor device may be measured and when the predetermined amount is reached, a unit storage activation signal may be generated (S800). A plurality of unit storage activation signals may be generated when the semiconductor device is repeatedly measured. Data indicating each occurrence of the generated unit storage activation signals may be stored in a storage circuit (e.g., a nonvolatile storage circuit) (S802). As described in FIG. 7, in one embodiment, the storing data may be performed by a program operation using an antifuse array.

The cumulatively stored data to detect use time of the semiconductor device may be read from the antifuse array (S804). The reading operation of the cumulatively stored use time may be performed, for example, by selecting an antifuse of the antifuse array through a row decoder and a column decoder by a control circuit and reading information stored in the selected antifuse through a sense amplifier.

Figure 8B:
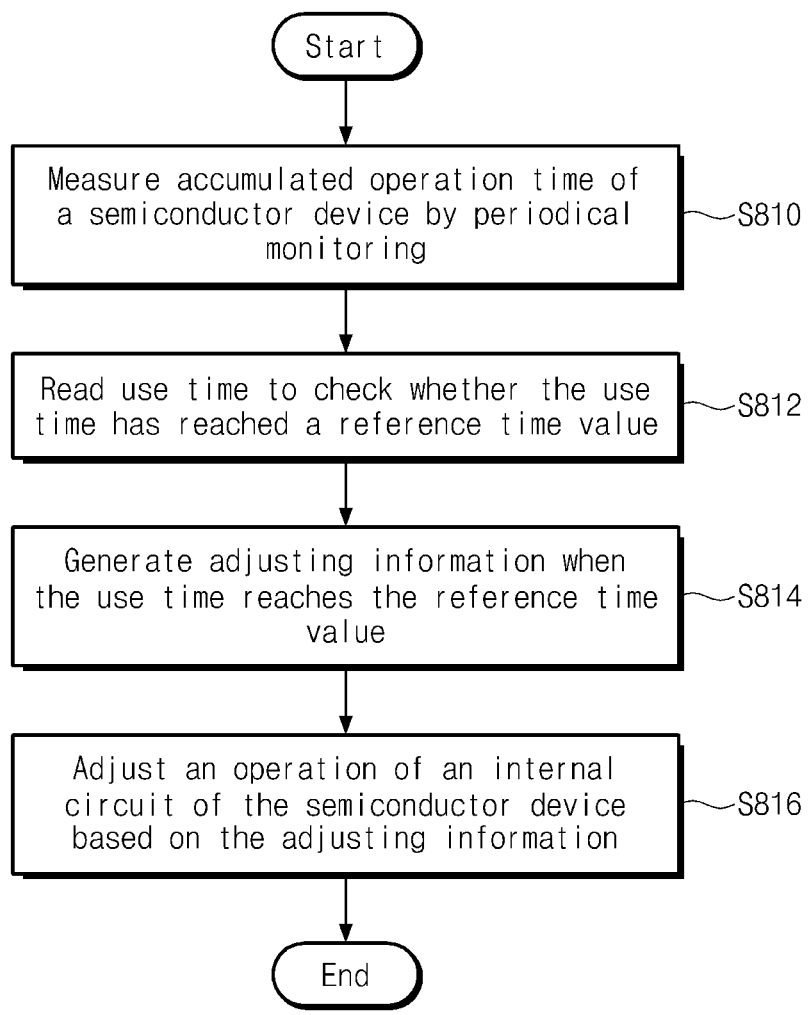

FIG. 8B is a flowchart summarizing use time management according to FIG. 2 according to example embodiments.

During the operation of a semiconductor device, accumulated operation time of the semiconductor device may be monitored in units of time periods to be measured (S810). Thus, a unit storage activation signal explained with reference to FIG. 5 or 6 may be generated in units of time periods. A plurality of unit storage activation signals may be generated when the semiconductor device is repeatedly measured.

Data indicating each occurrence of the generated unit storage activation signals may be stored in a storage circuit (e.g., a nonvolatile storage circuit) (5812). As described in FIG. 7, the storing data may be performed by a program operation using an antifuse array.

The cumulatively stored data to detect use time of the semiconductor device may be read from the antifuse array (S814). The reading operation of the cumulatively stored use time may be performed by selecting an antifuse of the antifuse array through a row decoder and a column decoder by a control circuit and reading information stored in the selected antifuse through a sense amplifier. The read use time may be compared with a reference time value to generate adjusting information. For example, the reference time value may be, for example, 4K×CLKn or 4K×CLKi of FIGS. 5 and 6.

When the cumulative use time reaches a reference time value, adjusting information may be generated to adjust an operation for an internal circuit of the semiconductor device (S816). The adjusting information may be generated by comparing the cumulative use time with the reference time value.

Figure 9:
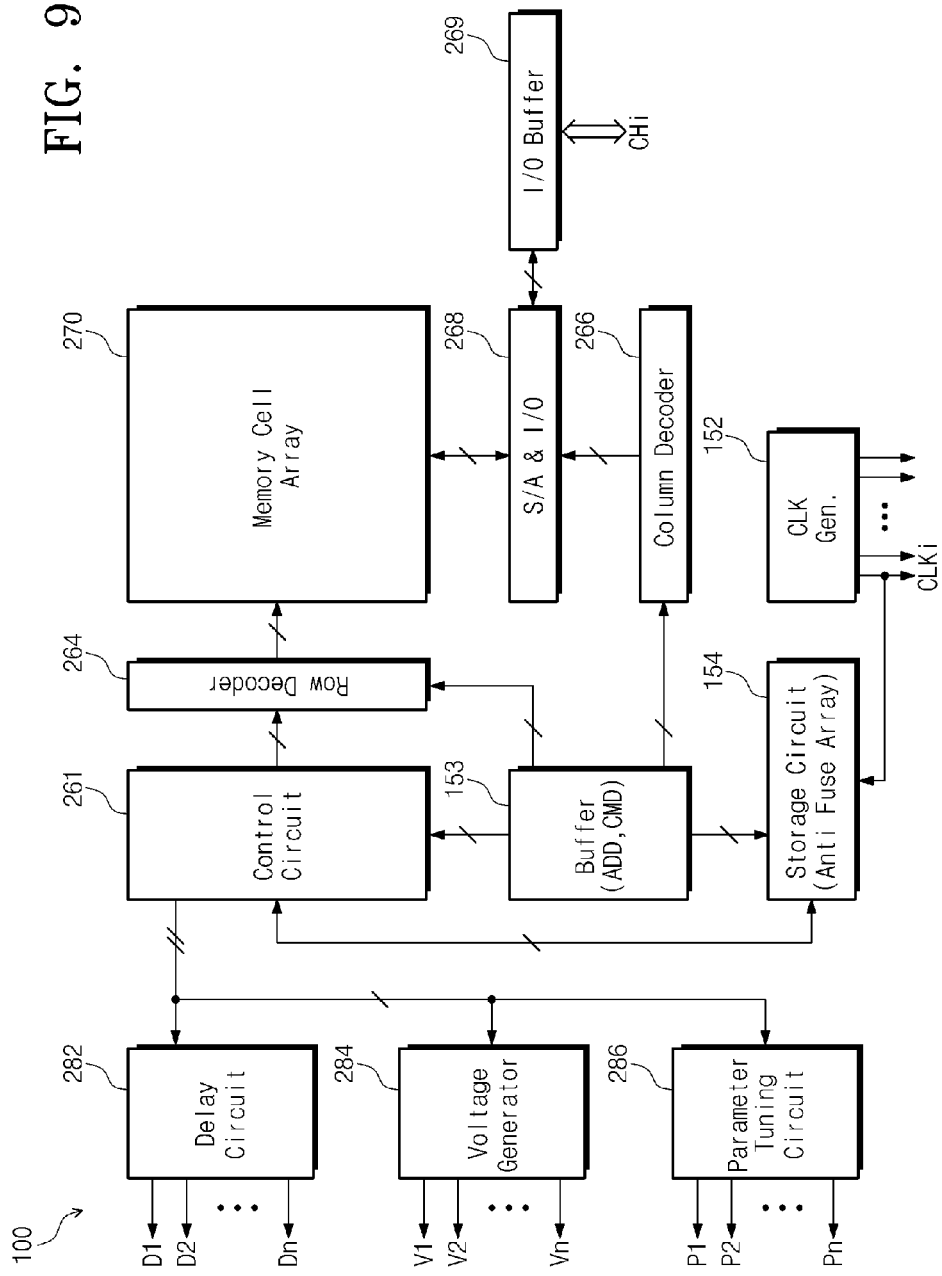
FIG. 9 is an exemplary block diagram of implementing the semiconductor device in FIG. 1 according to one embodiment.

FIG. 9 is an exemplary block diagram of implementing the semiconductor device in FIG. 1 according to one embodiment. As illustrated, the semiconductor device, as a memory device 100, may include a control circuit 261, a row decoder 264, a column decoder 266, a memory cell array 270, a sense amplifier and input/output circuit (S/A & I/O) 268, an input/output buffer (I/O Buffer) 269, a buffer 253, a storage circuit 154, a clock generator 152, a delay circuit 282, a voltage generator 284, a parameter tuning circuit 286.

The clock generator 152 may generate clock signals shown in FIG. 5 or 6. Among the clock signals, a certain output clock signal of CLK1, CLK2, CLKn or CLKi may be selected as the unit storage activation signal.

The storage circuit 154 may be implemented with an antifuse array including antifuses. The antifuse array may serve as the use time recorder 154 in FIG. 2.

The control circuit 261 may serve as the use time reader 156 and the adjusting information generator 158 in FIG. 2. In one embodiment, the use time reader 156 may output data indicating use time of the memory device 100 and may transfer the data through one or more input/output pads (e.g., DQ pads) or one or more separate pads.

The adjusting information may be provided to at least one of the delay circuit 282, the voltage generator 284, and the parameter tuning circuit 286.

For example, when the adjusting information is applied to the delay circuit 282, the delay circuit 282 changes delay amount of at least one of delay output signals D1 to Dn. As use time of a semiconductor device elongates, the delay amount may change from initially setting delay amount due to the PVT effect. When the delay amount is adjusted to match a statistical value of the delay amount varying depending on the use time of the semiconductor device, the delay amount of the semiconductor device may be recovered to the initially setting value.

In FIG. 9, the memory cell array 270 may include DRAM memory cells each including a single access transistor and a single storage capacitor. The memory cells may be arranged in a matrix of rows and columns. For example, the memory cell array 270 may be divided into a plurality of banks.

The control circuit 261 may receive an applied control signal to generate an internal control signal to control an operation mode to access data.

The buffer 153 may receive an applied address to perform buffering. The buffer 153 may provide a row address to select a row of the memory cell array 270 to the row decoder and provide a column address to select a column of the memory cell array 270 to the column decoder 266.

The buffer 153 receives an applied command to perform buffering. The command is applied to the control circuit 261 to be decoded.

The row decoder 264 decodes the row address in response to the internal control signal. When a result of decoding the row address is applied to the memory cell array 270, a selected one of wordlines connected to memory cells is enabled.

The column decoder 266 decodes the column address in response to the internal control signal. Column gating is performed according to the decoded column address. As a result of performing the column gating, a selected one of bitlines connected to the memory cells is driven.

The sense amplifier and input/output circuit 268 detects a potential appearing on a selected bitline of the selected memory cell to sense data stored in the selected memory cell.

The input/output buffer 269 buffers input/output data. In a read operation mode, the input/output buffer 269 buffers data read out from the sense amplifier and input/output circuit 268 and outputs the read-out data to a channel Chi (e.g., an input/output pad DQ).

Figure 10:
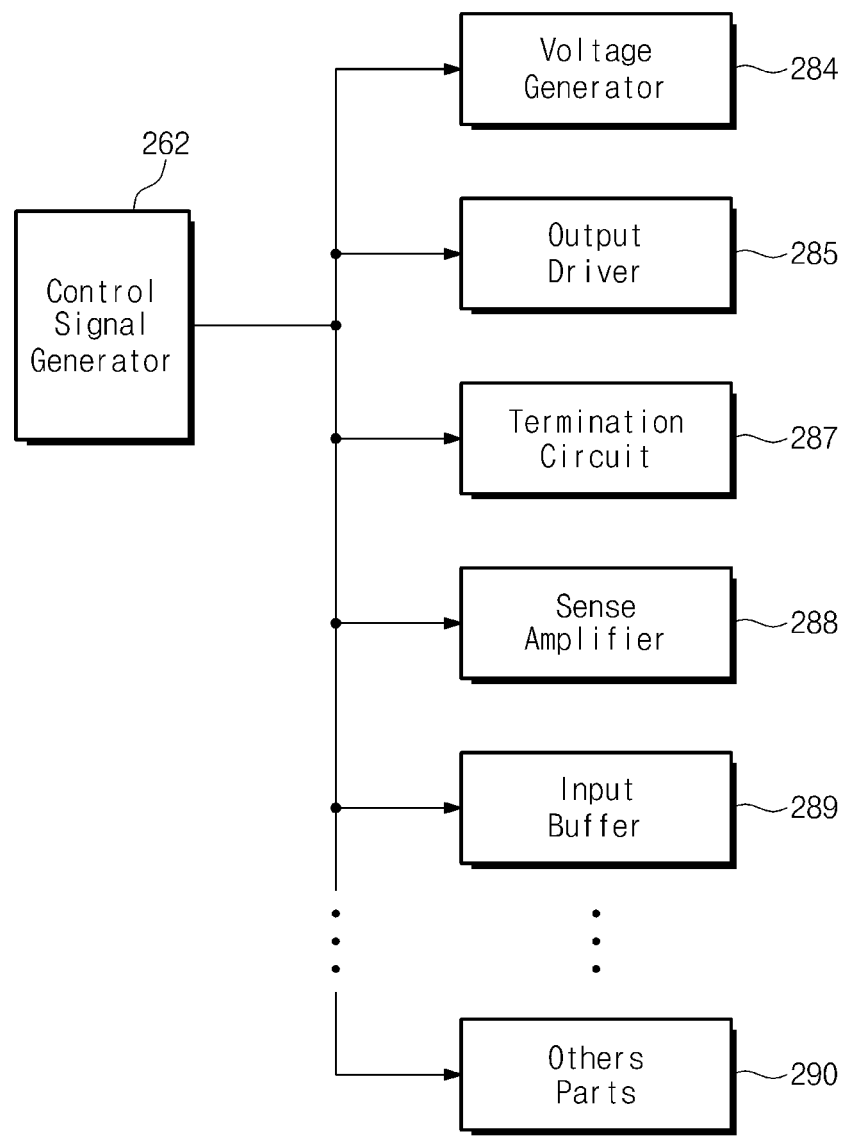
FIG. 10 is an exemplary block diagram illustrating adjusting information transfer of a control circuit in FIG. 9 according to one embodiment.

FIG. 10 is an exemplary block diagram illustrating an adjusting information transfer of the control circuit 261 in FIG. 9 according to one embodiment. In FIG. 10, it is exemplarily shown that a control signal generator 262 in the control circuit 261 applies adjusting information to various functional circuits 284 to 290. For example, the control signal generator 262 may correspond to the adjusting information generator 158 of FIG. 2.

The adjusting information may be applied to at least one of, for example, voltage generator 284, an output driver 285, a termination circuit 287, a sense amplifier 288, an input buffer 289, and other parts 290.

The voltage generator 284 may include an internal voltage generator, a high voltage generator or a substrate voltage generator.

Figure 11:
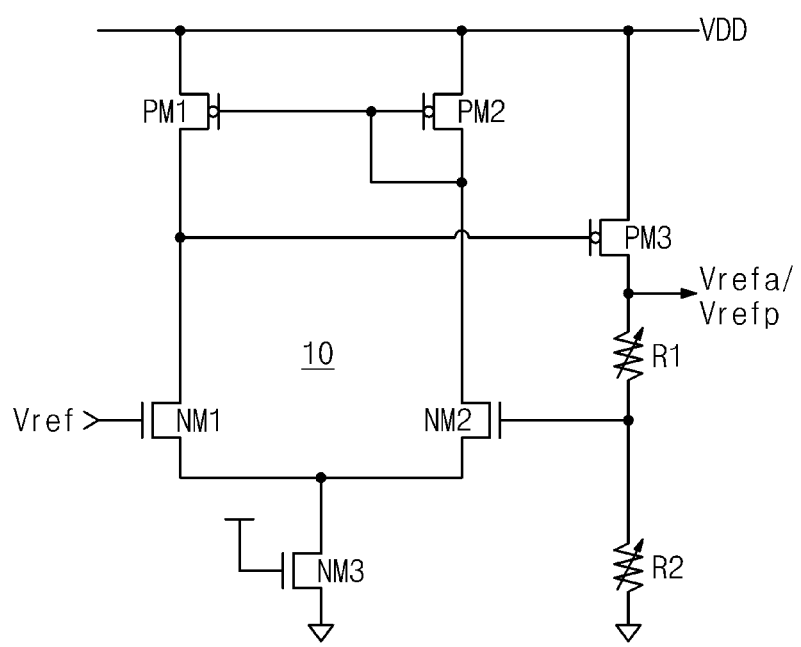
FIG. 11 is an exemplary circuit diagram of an internal voltage generator in FIG. 10 according to one embodiment.

FIG. 11 is an exemplary circuit diagram of the internal voltage generator in FIG. 10 according to one embodiment. More specifically, the internal voltage generator is shown in the form of a reference voltage generator to generate a reference voltage Vrefa for a memory cell array of a semiconductor device or a reference voltage Vrefp for a peripheral circuit of the semiconductor device.

The reference voltage generator in FIG. 11 may include a current mirror type differential amplifier 10 including PMOS transistors PM1 and PM2 and NMOS transistor NM1 to NM3, a PMOS transistor PM3 for driving, and first and second variable resistors R1 and R2. A typical reference voltage generator may have substantially the same configuration as shown in FIG. 11, apart from the first and second variable resistors R1 and R2.

In one embodiment, adjusting information may change resistances of the first and second variable resistors R1 and R2 in the reference voltage generator to adjust reference voltage output characteristics (e.g., a level of the Vrefa or Vrefp). More specifically, reference voltages Vrefa and Vrefp may be increased by increasing the resistance of the first variable resistor R1 or decreasing the resistance of the second variable resistor R2, while the reference voltages Vrefa and Vrefp may be decreased by decreasing the resistance of the first variable resistor R1 or increasing the resistance of the second variable resistor R2.

Figure 18:
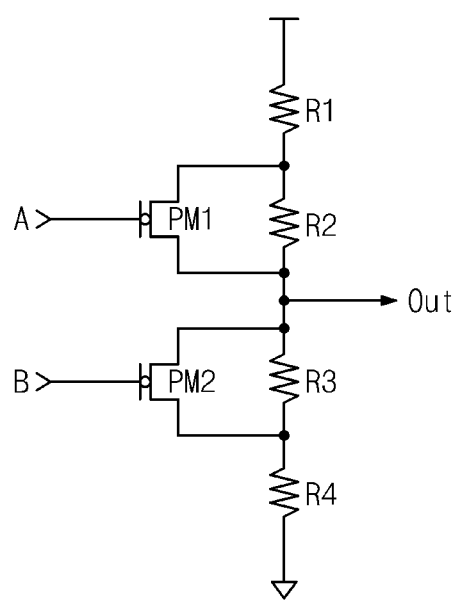
FIG. 18 is an exemplary circuit diagram of a variable voltage regulator responding to adjusting information according to FIG. 10 according to one embodiment.

The principle of changing the resistances of the first and second variable resistors R1 and R2 according to the adjusting information is illustrated in FIG. 18.

FIG. 18 is an exemplary circuit diagram of a variable voltage regulator based on adjusting information of FIG. 10 according to one embodiment. A connection structure between PMOS transistors PM1 and PM2 and first to fourth resistors R1 to R4 is shown in FIG. 18. Assuming that adjusting information is applied to a gate terminal of the PMOS transistor PM1 as a control signal A, the resistor R2 is selectively disconnected from or connected to the resistor R1 according to a turn-on or turn-off operation of the PMOS transistor PM1. For example, when the PMOS transistor PM1 is turned on, only the resistance of the first resistor R1 exists between a power supply voltage and an output terminal OUT. When the PMOS transistor PM1 is turned off, a serial composite resistance obtained by adding the resistances of the first and second resistors R1 and R2 exists between the power supply voltage and the output terminal OUT. The serial composite resistance is higher than the resistance of the first resistor R1.

Assuming that adjusting information is applied to a gate terminal of the PMOS transistor PM2 as a control signal B, a resistor R3 is selectively disconnected from or connected to a resistor R4 according to a turn-on or turn-off operation of the PMOS transistor PM2. For example, when the PMOS transistor PM2 is turned on, only a resistance of the fourth resistor R4 exists between the output terminal OUT and a ground. When the PMOS transistor PM2 is turned off, a serial composite resistance obtained by adding resistances of the third and fourth resistors R3 and R4 exists between the output terminal OUT and the ground. The serial composite resistance is higher than the resistance of the fourth resistor R4.

A variable resistor element is configured with the structure in FIG. 18 to adjust output characteristics (e.g., a voltage level) of a reference voltage Vrefa for a memory cell array or a reference voltage Vrefp for a peripheral circuit according to the adjusting information. For example, resistors of FIG. 18 may be further added in series and a transistor may be further connected in parallel to each transistor. Thus, a level of an output voltage OUT may be adjusted more minutely.

Returning to FIG. 11, the reference voltage output characteristics (e.g., a voltage level) are adjusted based on the principle explained in FIG. 18 by varying the resistances of the first and second variable resistances R1 and R2 in the reference voltage generator. The resistance of the first variable resistor R1 or the resistance of the second variable resistor R2 may be adjusted by controlling transistors for control using the adjusting information.

Figure 12:
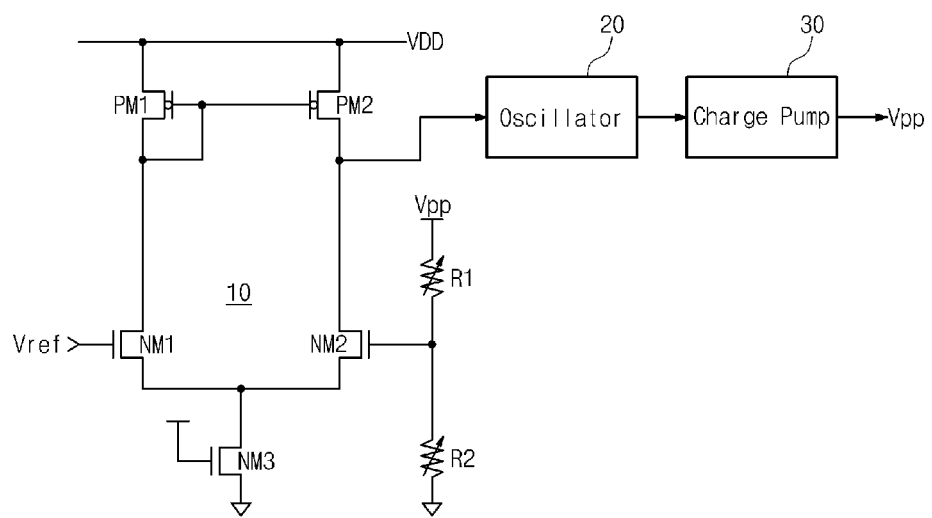
FIG. 12 is an exemplary circuit diagram of a high voltage generator in FIG. 10 according to one embodiment.

FIG. 12 is an exemplary circuit diagram of the high voltage generator in FIG. 10 according to one embodiment. The high voltage generator of FIG. 12 may generate an output voltage Vpp for using a wordline boosting operation of a semiconductor device.

Referring to FIG. 12, the high voltage generator may include a current mirror type differential amplifier 10 including PMOS transistors PM1 and PM2 and NMOS transistors NM1 to NM3, an oscillator 20, a charge pump 30, and first and second variable resistors R1 and R2. A typical high voltage generator may have substantially the same configuration as shown in FIG. 12, apart from the first and second variable resistors R1 and R2.

Adjusting information may change resistances of the first and second variable resistors R1 and R2 in the high voltage generator to adjust voltage output characteristics (e.g., a voltage level of Vpp).

Similarly, the output voltage Vpp may be increased by increasing the resistance of the first variable resistor R1 or decreasing the resistance of the second variable resistor R2, while the output voltage Vpp may be decreased by decreasing the resistance of the first variable resistor R1 or increasing the resistance of the second variable resistor R2. Changing the resistances of the first and second variable resistors R1 and R2 according to the adjusting information may be achieved in the same manner as described in FIG. 18. For example, even in the case of FIG. 12, a level of the output voltage Vpp may be adjusted according to the adjusting information.

Figure 13:
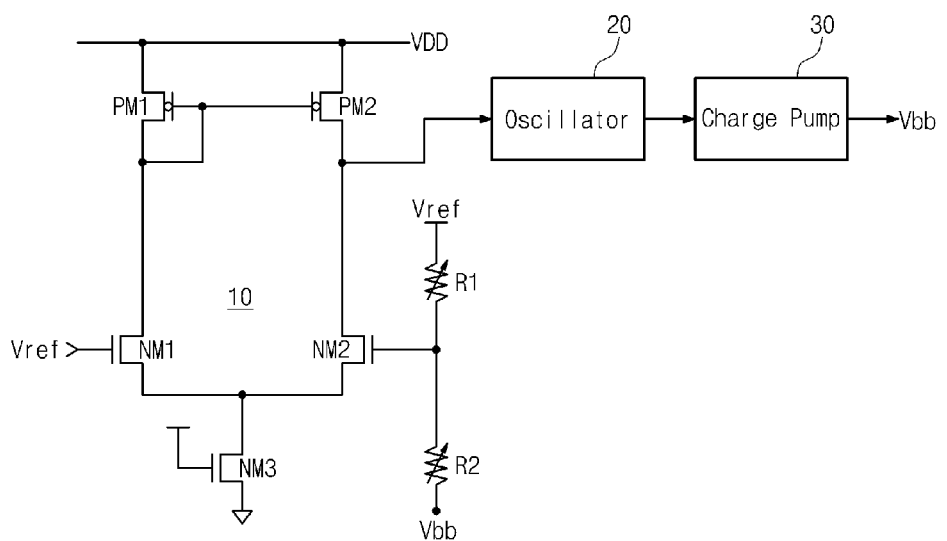
FIG. 13 is an exemplary circuit diagram of a substrate voltage generator in FIG. 10 according to one embodiment.

FIG. 13 is an exemplary circuit diagram of a substrate voltage generator in FIG. 10 according to one embodiment. A substrate bias voltage generator of FIG. 13 may generate a negative voltage (or a substrate bias voltage) Vbb applied to a substrate or a bulk of a semiconductor device.

Referring to FIG. 13, the substrate bias voltage generator may include a current mirror type differential amplifier 10 including PMOS transistor PM1 and PM2 and NMOS transistors NM1 to NM3, an oscillator 20, a charge pump 30, and first and second variable resistors R1 and R2. A typical substrate bias voltage generator may have substantially the same configuration as shown in FIG. 13, apart from the first and second variable resistors R1 and R2.

Adjusting information may change resistances of the first and second variable resistors R1 and R2 in the substrate voltage generator to adjust negative voltage output characteristics (e.g., a voltage level of Vbb).

Similar to the case of FIG. 12, the substrate bias voltage Vbb may be increased by increasing the resistance of the first variable resistor R1 or decreasing the resistance of the second variable resistor R2, while the substrate bias voltage Vbb may be decreased by decreasing the resistance of the first variable resistor R1 or increasing the resistance of the second variable resistor R2. Changing the resistances of the first and second variable resistors R1 and R2 according to the adjusting information may be achieved in the same manner as described in FIG. 18. For example, even in the case of FIG. 13, a level of the negative voltage Vbb may be adjusted according to the adjusting information.

Since the substrate bias voltage output characteristics may be degraded as the use time of the semiconductor device elongates, it is necessary to recover the substrate bias voltage output characteristics to an initial set output characteristic value.

Figure 14:
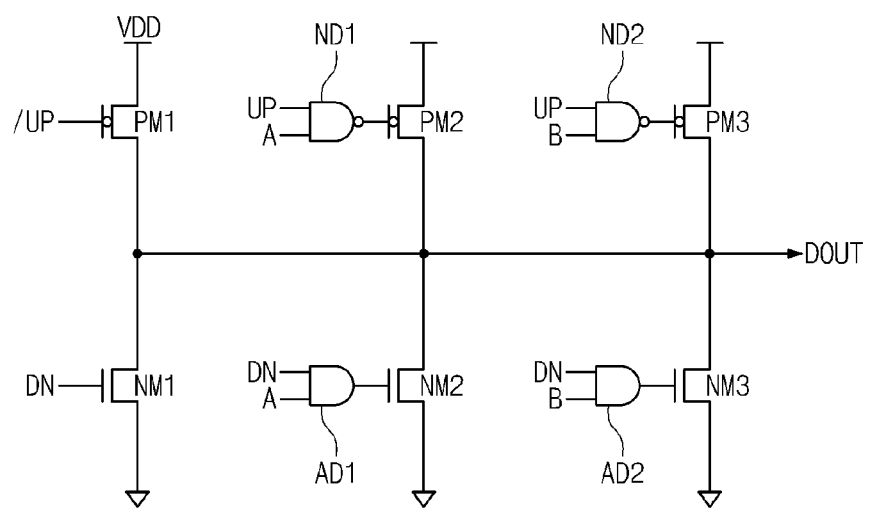
FIG. 14 is an exemplary circuit diagram of an output driver in FIG. 10 according to one embodiment.

FIG. 14 is an exemplary circuit diagram of an output driver 285 in FIG. 10, which may be implemented as an output driver of the semiconductor device in FIG. 9. A connection structure of pull-up PMOS transistors PM1 to PM3, pull-down NMOS transistors NM1 to NM3, first and second NAND gates ND1 and ND2, and first and second AND gates AD1 and AD2 is shown in FIG. 14.

An inverted pull-up control signal /UP may be applied to a the pull-up PMOS transistor PM1 and a pull-up control signal UP may be applied to one input terminal of each of the first and second NAND gates ND1 and ND2, and adjusting information A and B may be applied to the other input terminals as logic high or logic low. A pull-down control signal DN may be applied to the pull-down NMOS transistor NM1 and one input terminal of each of the first and second AND gates AD1 and AD2, and the adjusting information A and B may be applied to the other input terminals as logic high or logic low.

For example, when both of the pull-up control signal UP and the adjusting information A are applied as logic high (H), the pull-up PMOS transistors PM1 and PM2 participate in a driving operation of an output DOUT. For example, when both of the pull-down control signal DN and the adjusting information A are applied as logic high (H), the pull-down NMOS transistors NM1 and NM2 participate in an output driving operation of the output DOUT. Therefore, a driving capability of an output DOUT is made higher than when the pull-up PMOS transistor PM1 and the pull-down NMOS transistor NM1 are only driven. When temperature sensing data B is additionally applied as logic high (H), unit drivers in FIG. 14 are all driven. Therefore, the driving capability of the output DOUT is made much higher. As a result, in the case of FIG. 14, data output characteristics of the output driver may be adjusted.

Figure 15:
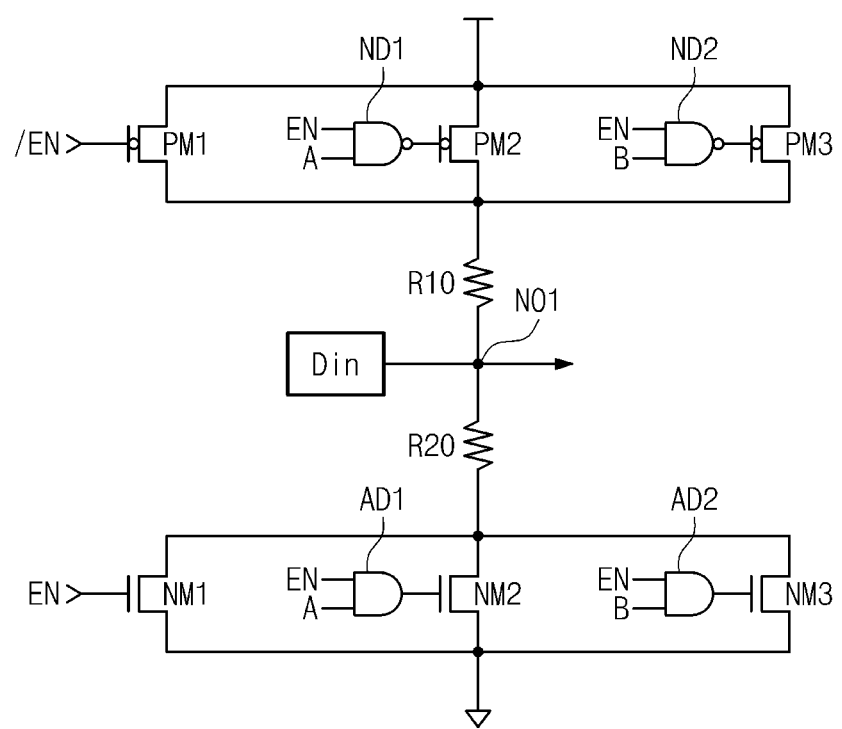
FIG. 15 is an exemplary circuit diagram of a termination circuit in FIG. 10 according to one embodiment.

FIG. 15 is an exemplary circuit diagram of a termination circuit 287 in FIG. 10 according to one embodiment. A connection structure of PMOS transistors PM1 to PM3, NMOS transistors NM1 to NM3, first and second NAND gates ND1 and ND2, first and second AND gates AD1 and AD2, resistors R10 and R20 is shown in FIG. 15. On-die termination of a signal Din applied to a node NO1 for impedance matching may be adjusted in a logic state of adjusting information. For example, when all of an enable signal EN and the adjusting information A and B are applied as logic high (H), the pull-up PMOS transistors PM1 and PM3 and pull-down NMOS transistors NM1 to NM3 are all turned on. For example, when both of the enable signal EN and the adjusting information A are applied as logic high (H), the pull-up PMOS transistors PM1 and PM2 and the pull-down transistors NM1 and NM2 are turned on. As a result, a termination resistor varies depending on adjusting information.

Figure 16:
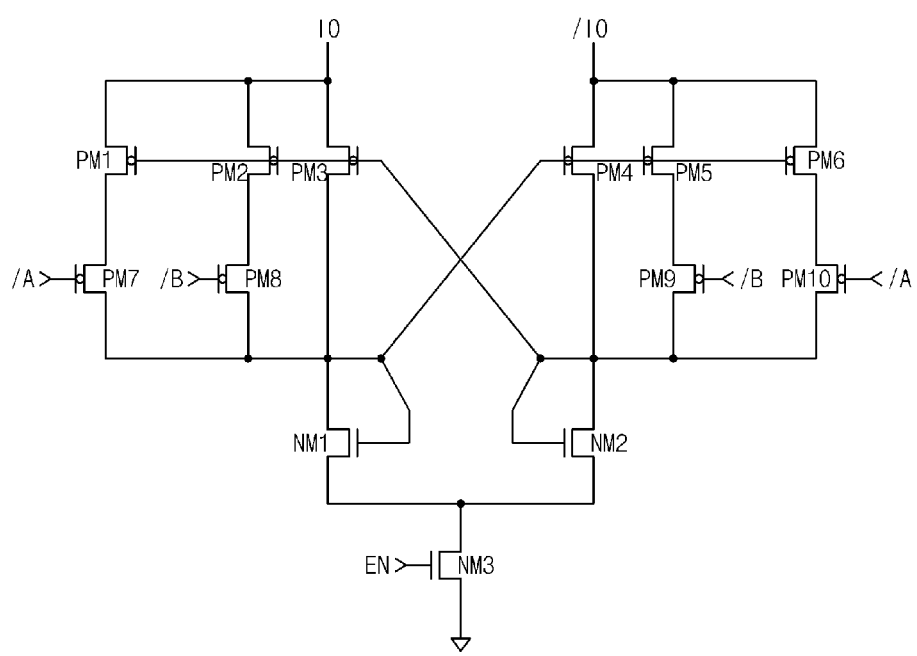
FIG. 16 is an exemplary circuit diagram of a sense amplifier in FIG. 10 according to one embodiment.

FIG. 16 is an exemplary circuit diagram of a sense amplifier in FIG. 10 according to one embodiment. Referring to FIG. 16, the configuration of a sense amplifier that may be located in the sense amplifier and input/output circuit 268 in FIG. 9. The sense amplifier may include PMOS transistors PM1 to PM10 and NMOS transistors NM1 to NM3. For example, when a sensing enable signal EN is applied as logic high (H) and inverted versions /A and /B of the adjusting information A and B are applied as logic low (L), the PMOS transistors PM7 to PM10 are turned on such that a sensing ability of the sense amplifier may be increased. For example, when the inverted adjusting information /A and /B are applied as logic high (H), the PMOS transistors PM7 to PM10 are turned off such that a sensing ability of the sense amplifier may be decreased.

Figure 17:
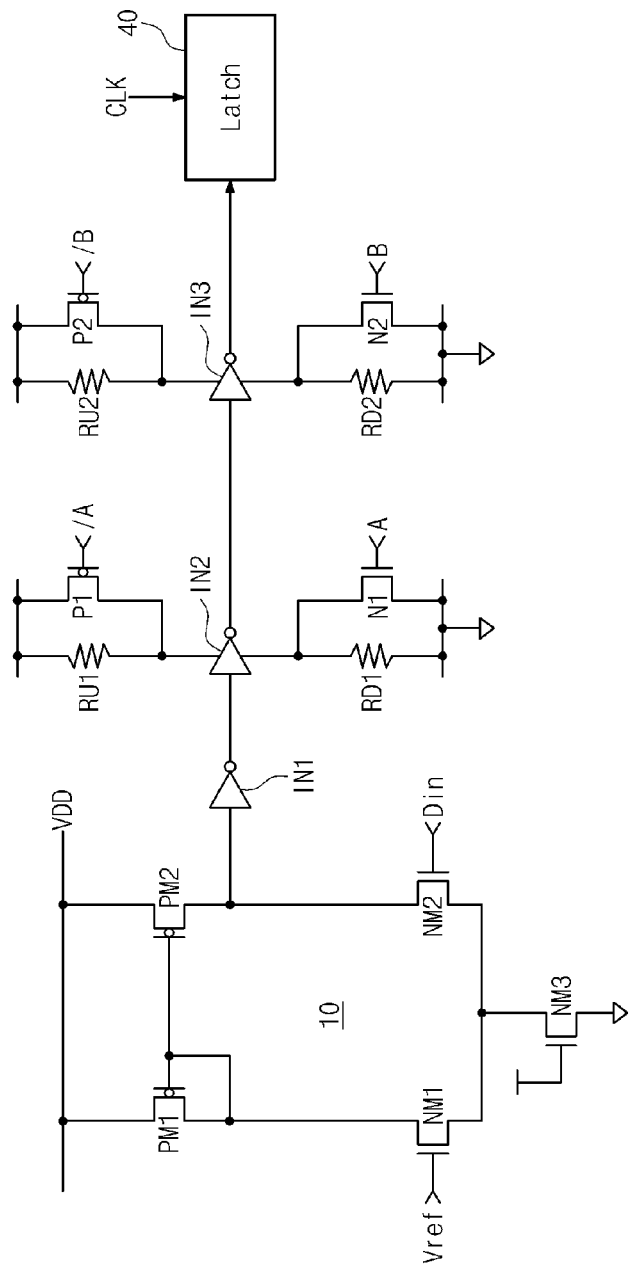
FIG. 17 is an exemplary circuit diagram of an input buffer in FIG. 10 according to one embodiment.

FIG. 17 is an exemplary circuit diagram of an input buffer 289 in FIG. 10 according to one embodiment. As illustrated, the input buffer 289 may include a current mirror type differential amplifier 10 including PMOS transistors PM1 and PM2 and NMOS transistors NM1 to NM3, variable resistors RU1, RU2, RD1, and RD2, MOS transistors P1, P2, N1, and N2, and a latch 40.

The adjusting information A and B and the inverted adjusting information /A and /B may be correspondingly applied to gates of the NMOS transistors N1 and N2 and PMOS transistors P1 and P2, respectively. For example, when the NMOS transistors N1 and N2 and the PMOS transistors P1 and P2 are all turned on, corresponding resistors RU1, RU2, RD1, and RD2 are operatively disconnected not to participate in a delay operation. For example, when the NMOS transistors N1 and N2 and the PMOS transistors P1 and P2 are all turned off, the resistors RU1, RU2, RD1, and RD2 are operatively connected to participate in the delay operation. Thus, setup and hold time of a data input buffer may be adjusted according to the adjusting information.

As described above, when use time of a semiconductor device cumulatively stored in a nonvolatile storage circuit is read and the read use time reaches a reference time value, adjusting information may be applied to various internal circuits of the semiconductor device.

Figure 19:
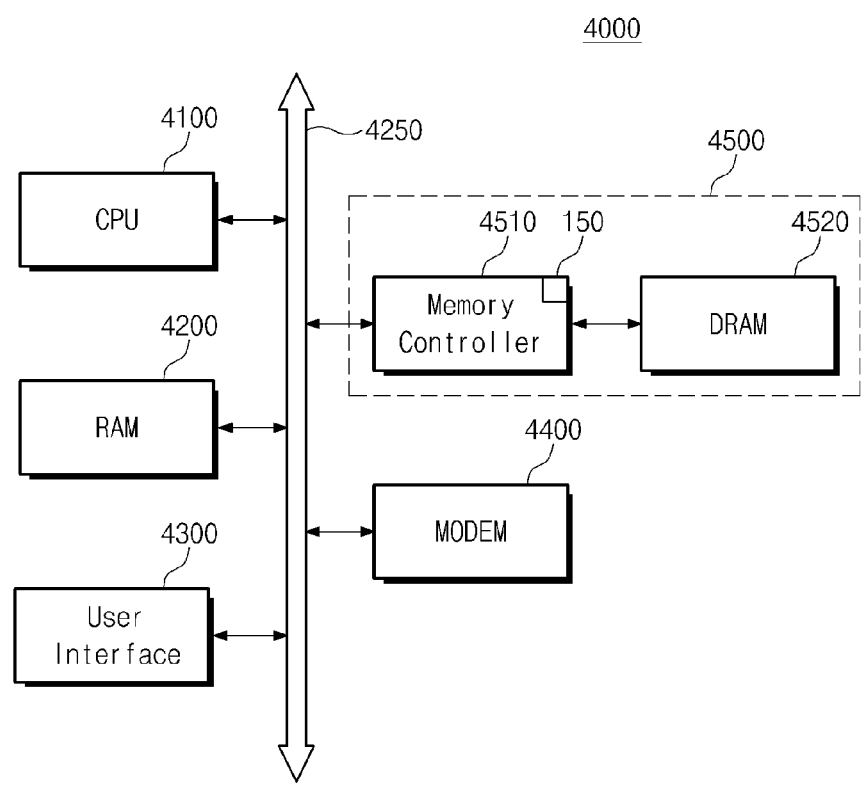
FIG. 19 is a block diagram illustrating a computing system according to certain embodiments.

FIG. 19 is a block diagram illustrating a computing system according to certain embodiments. As illustrated, the computing system 4000 may include a memory system 4500 including a DRAM 4520 and a memory controller 4510. The computing system 4000 may include an information processing device or a computer. The computing system 4000 may further include a modem 4400, a central processing unit (CPU) 4100, a RAM 4200, and a user interface 4300 that are electrically connected to a system bus 4250. Data processed by the CPU 4100 or externally input data may be stored in the memory system 4500.

For example, if the DRAM 4520 is a DDR4 DRAM, the DRAM 4520 may be manufactured with at least two dies in a mono package.

The computing system 4000 may be applied to a solid state disk (SSD), a camera image sensor, and other application chipsets. In some embodiments, the memory system 4500 may be configured with an SSD. In this case, the computing system 4000 may stably and reliably store large-capacity data in the memory system 4500.

In the memory system 4500, the memory controller 4510 may apply a command, an address, data or other control signals to the DRAM 4520.

The CPU 4100 functions as a host and controls the overall operation of the computing system 4000.

A host interface between the CPU 4100 and the memory controller 4150 may include various protocols for data exchange between a host and the memory controller 4500. In exemplary embodiments, memory controller 4510 may be configured to communicate with a host or an external device through one of various interface protocols such as USB (Universal Serial Bus) protocol, MMC (Multimedia Card) protocol, PCI (Peripheral Component Interconnection) protocol, PCI-E (PCI-Express) protocol, ATA (Advanced Technology Attachment) protocol, SATA (Serial ATA) protocol, ESDI (Enhanced Small Disk Interface) protocol, and IDE (Integrated Drive Electronics) protocol. The memory controller 4510 may include a use time managing circuit 150 including a configuration such as shown in FIG. 2. Thus, use time of the DRAM 4250 may be monitored during the operation of the DRAM 4250.

The computing system 4000 shown in FIG. 19 may be applied as one of a computer, an Ultra Mobile PC (UMPC), a digital picture player, a digital video recorder, a digital video player, a storage constituting a data center, a device capable of transmitting/receiving data in an wireless environment and various electronic devices constituting a home network, one of various electronic devices constituting a computer network, one of various electronic devices constituting a telematics network, a radio-frequency identification (RFID) device, or one of various constituents constituting a computing system.

In FIG. 19, the DRAM 4250 may include a use time managing circuit 150 including a configuration such as shown in FIG. 2. Thus, use time of the DRAM 4250 may be monitored during the operation of the DRAM 4250. For example, generated adjusting information may be applied to each functional circuit to minimize or prevent occurrence of a field error. As a result, operation performance of the computing system 4000 may be improved.

In FIG. 19, the DRAM 4520 includes a memory cell array including normal memory cells and spare memory cells. The normal memory cells are used to store written data or output read data during a memory access operation. The spare memory cells are cells disposed in a redundancy memory area and are used to repair defective ones of the normal memory cells. For example, when a defect occurs in a certain normal memory cell, it is replaced with a spare memory cell. Thus, a wordline or a column select line connected to the defective normal memory cell is disabled and a spare wordline or a spare column select line connected to the spare memory cell is enabled when an address corresponding to a defective normal memory cell is applied.

The DRAM 4520 may be a DRAM or a synchronous DRAM (SDRAM) having a spare memory cell array. The memory controller 4510 may function as a DRAM controller when a memory in FIG. 19 is a DRAM and function as an SDRAM controller when the memory in FIG. 19 is an SDRAM.

Although a DRAM is connected as a memory in FIG. 19, an MRAM may be mounted instead of the DRAM in another case.

Volatile memory devices such as SRAM and DRAM may lose their stored data when their power supplies are interrupted, while nonvolatile memory devices such as MRAM retain their stored data even when their power supplies are interrupted. Accordingly, nonvolatile memory devices are preferentially used to store data when data does not want to be lost by power failure or power-off.

When a spin transfer torque magneto resistive random access memory (STT-MRAM) constitutes a memory module, advantages of an MRAM may be added to the advantages of a DRAM.

An STT-MRAM cell may include a magnetic tunnel junction (MTJ) element and a select transistor. The MTJ element may basically include a pinned layer, a free layer, and a tunnel layer disposed therebetween. A magnetization direction of the pinned layer is fixed, and a magnetization of the free layer is identical or reverse to that of the pinned layer according to conditions.

Figure 20:
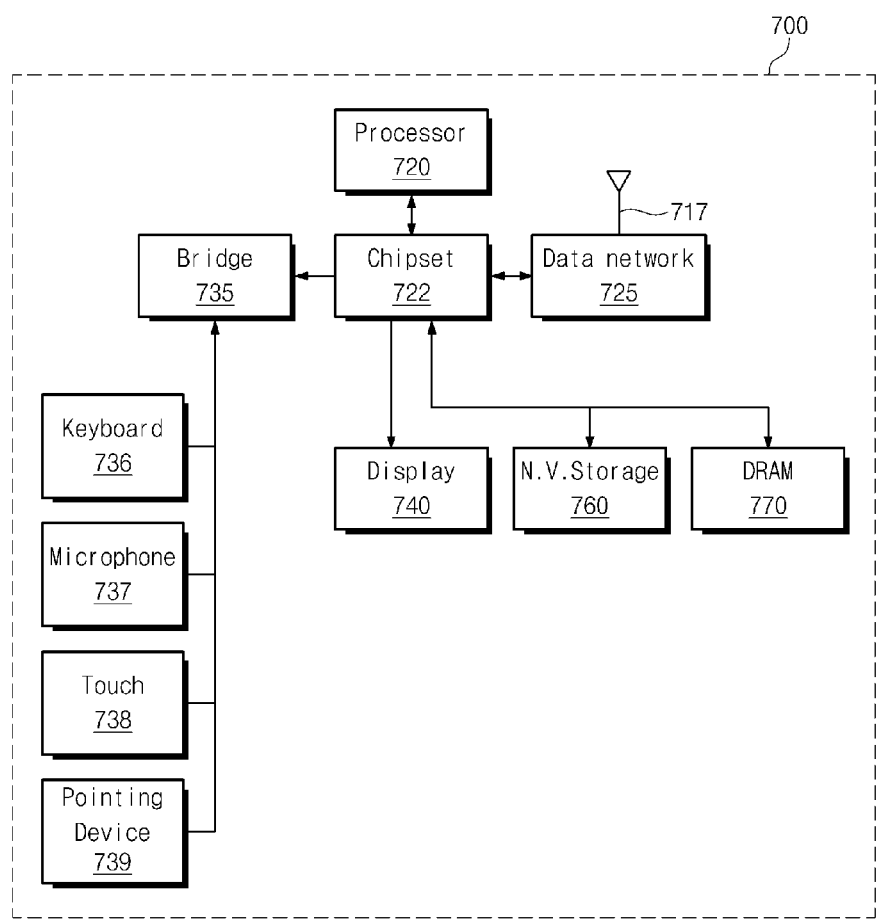
FIG. 20 is a block diagram illustrating a handheld terminal according to certain embodiments.

FIG. 20 is a block diagram illustrating a handheld terminal 700 according to certain embodiments. As illustrated, the handheld terminal 700 may include a processor 720, a chipset 722, a data network 725, a bridge 735, a display 740, a nonvolatile storage 760, a DRAM 770, a keyboard 736, a microphone 737, a touch unit 738, and a pointing device 739.

In FIG. 20, the DRAM 770 may include a use time managing circuit 150 including a configuration such as shown in FIG. 2. Thus, use time of a DRAM may be monitored during the operation of the DRAM. For example, generated adjusting information may be applied to each functional circuit to minimize or prevent occurrence of a field error. As a result, operation performance depending on long-term use of the handheld terminal 700 may be improved.

The chipset 722 may apply a command, an address, data or other control signals to the DRAM 770.

The processor 720 functions as a host and controls the overall operation of the personal computer 700.

A host interface between the processor 720 and the chipset 722 includes various protocols for performing data communication.

The nonvolatile storage 760 may be implemented with, for example, an electrically erasable programmable read-only memory (EEPROM), a flash memory, a magnetic RAM (MRAM), a spin-transfer torque MRAM (STT-MRAM), CBRAM (a conductive bridging RAM (CBRAM), a ferroelectric RAM (FRAM), a phase change RAM (PRAM) called an ovonic unified memory (OUM), a resistive RAM (RRAM or ReRAM), nanotube RRAM, a nanotube RRAM, a polymer RAM (PoRAM), a nano floating gate memory (NFGM), holographic memory, a molecular electronics memory device or an insulator resistance change memory.

The handheld terminal 700 in FIG. 20 may be provided as one of various elements constituting an electronic device such as a computer, an ultra-mobile PC (UMPC), a workstation, a net-book, a personal digital assistant (PDA), a portable computer, a web tablet, a wireless phone, a mobile phone, a smart phone, an e-book, a portable multimedia player (PMP), a portable game device, a navigation device, a black box, a digital camera, a digital multimedia broadcasting (DMB) player, a three-dimensional television, a smart television, a digital audio recorder, a digital audio player, a digital picture recorder, a digital picture player, a digital video recorder, and a digital video player, a device capable of transmitting/receiving information in wireless environment, of various electronic devices constituting a home network, an RFID device or one of various elements constituting a computing system.

Figure 21:
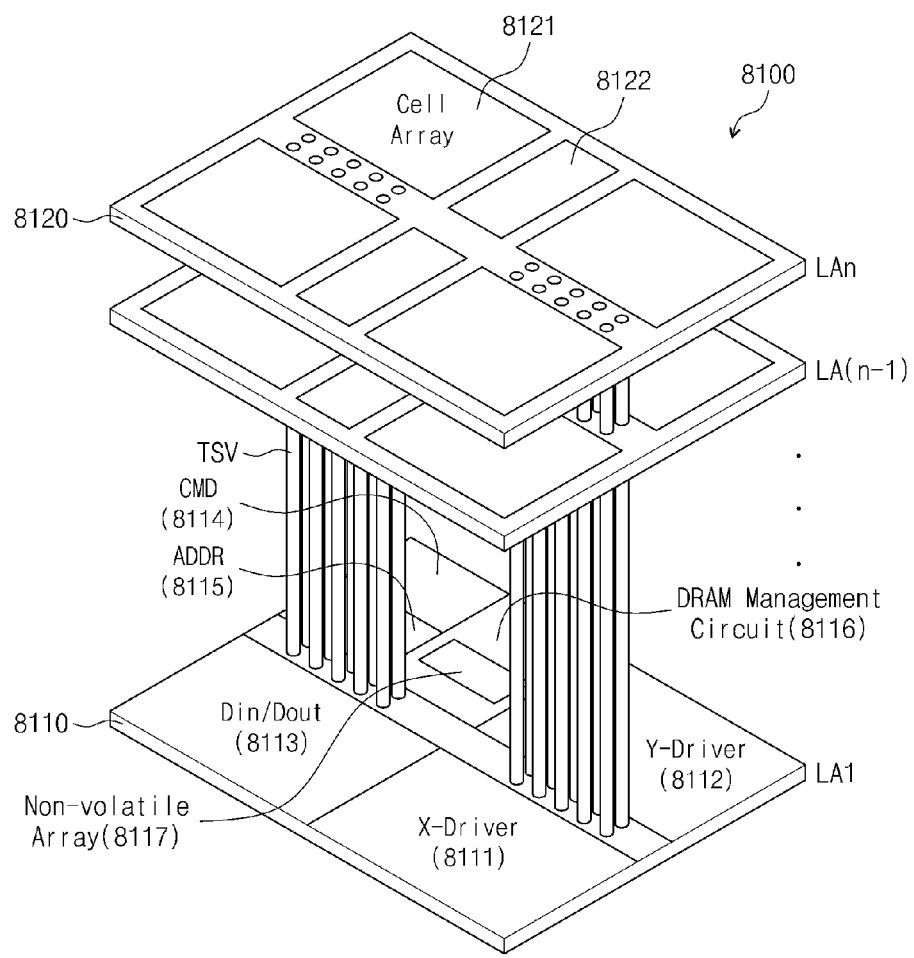
FIG. 21 is a block diagram illustrating a semiconductor memory system according to certain embodiments.

FIG. 21 is a block diagram illustrating a semiconductor memory system 8100 according to certain embodiments. A semiconductor memory device implemented by stacking a plurality of semiconductor layers is shown in FIG. 21.

As illustrated in FIG. 21, the semiconductor memory system 8100 may include a plurality of semiconductor layers LA1 to LAn. Each of the semiconductor layers LA1 to LAn may be a memory chip including a DRAM cell. Alternatively, some of the semiconductor layers LA1 to LAn may be master chips interfacing with an external controller and the other layers may be slave chips to store data. In the example of FIG. 12, let it be assumed that a lowermost semiconductor layer LA1 is a master chip and the other semiconductor layers LA2 to LAn are slave chips.

The semiconductor layers LA1 to LAn transmit and receive a signal to and from each other through a through-substrate via (e.g., a through-silicon via (TSV)), and the master chip LA1 communicates with an external memory controller through an external conductive element. The configuration and operation of the semiconductor memory system 8100 will be described below by focusing on the first semiconductor layer 8110 as a master chip and an $n^{th}$ semiconductor layer 8120 as a slave chip.

The first semiconductor layer 8110 may include various types of circuits to drive a cell array 8121 included in slave chips. For example, the first semiconductor layer 8110 may include a row driver (X-Driver) 8111 to drive a wordline of a cell array 8121, a column driver (Y-Driver) 8112 to drive a bitline of the cell array 8121, an input/output circuit 8113 to control data input/output, a command decoder 8114 to decode an external command CMD, and an address buffer 8115 to receive and buffer an external address.

The first semiconductor layer 8110 may further include a DRAM management circuit 8116 to manage a memory operation of a slave chip. The DRAM management circuit 8116 may include a nonvolatile array 8117 that may be stored weak page addresses, memory characteristics of areas of the cell array 8121 or information associated with a sub-block. When receiving a row command accompanied by a specific one (e.g., row address) of commands received from an external controller, the DRAM management circuit 8116 may compare the row address with the information stored in the nonvolatile array 8117 and provide a flag FLAG or information bits Info Bits depending on a result of the comparison.

The $n^{th}$ semiconductor layer 8120 may include a cell array 8121 and a peripheral circuit area 8122 in which other peripheral circuits to drive the cell array 8121, e.g., a row/column selector to select a row and a column and a bitline sense amplifier are disposed.

In FIG. 21, the DRAM management circuit 8116 may include a use time managing circuit 150 including a configuration such as shown in FIG. 2. Thus, use time of a DRAM in the semiconductor memory system 8100 may be monitored during the operation of the DRAM in the semiconductor memory system 8100. For example, generated adjusting information may be applied to each functional circuit block to minimize or prevent occurrence of a field error. As a result, operation performance of the semiconductor memory system 8100 may be improved.

Figure 22:
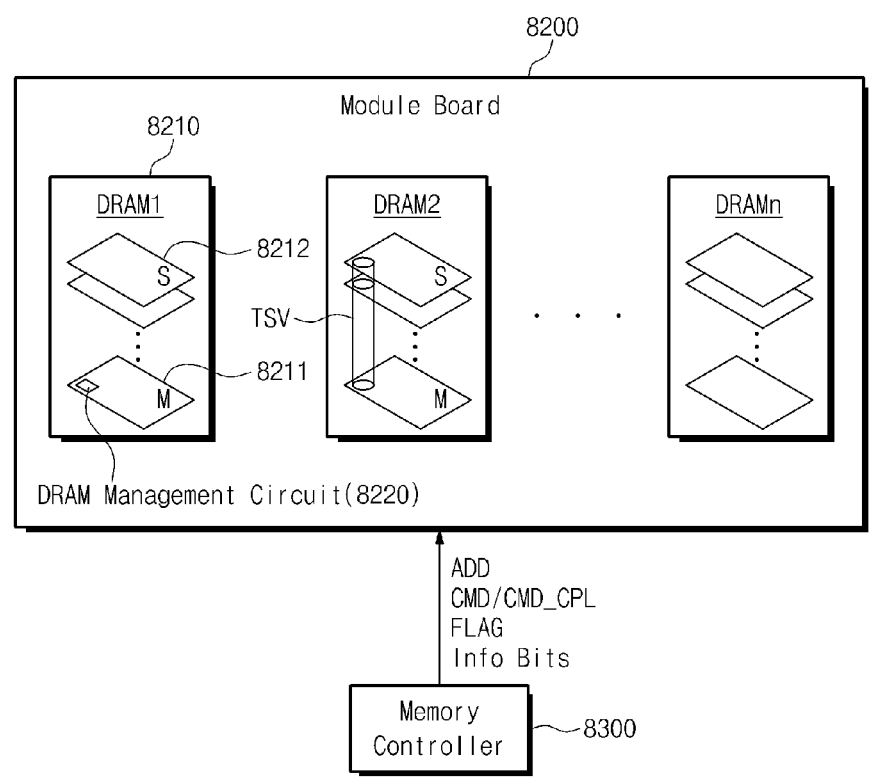
FIG. 22 is a block diagram illustrating a memory module according to certain embodiments.

FIG. 22 is a block diagram illustrating a memory module 8200 according to certain embodiments. For the convenience of description, not only the memory module 8200 but also a memory controller 8300 is shown in FIG. 13.

As illustrated in FIG. 22, the memory module 8200 may include one or more semiconductor memory devices 8210 mounted on a module board. The semiconductor memory device 8210 may be implemented with a DRAM chip. Each of the semiconductor memory devices 8210 may include a plurality of semiconductor layers. The semiconductor layers may include one or more master chips 8211 and one or more slave chips 8212.

Signal transmission between the semiconductor layers may be done through a through-substrate via (e.g., a through-silicon via (TSV)). The memory module 8200 communicates with the memory controller 8300 to transmit and receive command CMD/CMD CPL, address ADD, flag FLAG, and information bits Info Bits between the memory module 8200 and the memory controller 8300.

In FIG. 22, the semiconductor memory device 8210 may include the DRAM management circuit 8220 shown in FIG. 21. The DRAM management circuit 8220 may include a use time managing circuit 150 including a configuration such as shown in FIG. 2. Thus, use time of a DRAM in the memory module 8200 may be monitored during the operation of the DRAM. For example, generated adjusting information may be applied to each functional circuit to minimize or prevent occurrence of a field error. As a result, operation performance depending on long-term use of the memory module 8200 may be improved.

Figure 23:
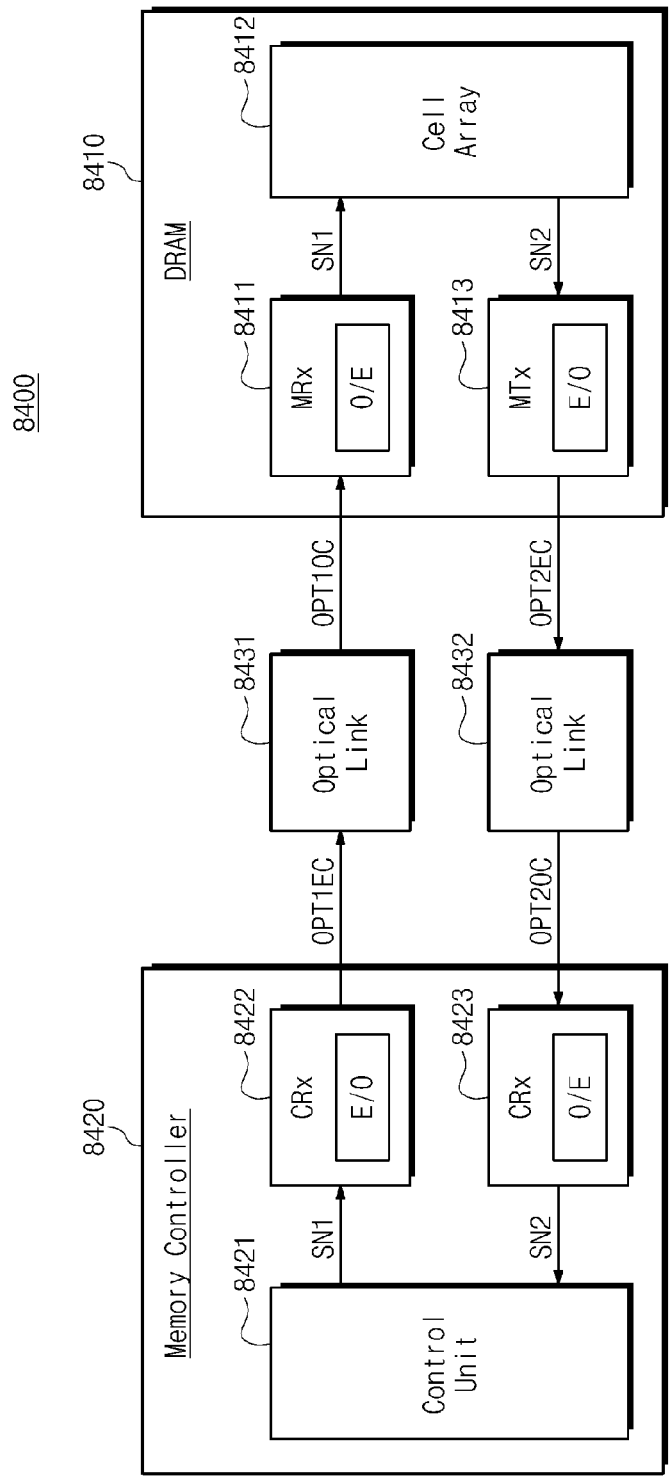
FIG. 23 is a block diagram illustrating an optical linked semiconductor memory system according to certain embodiment.

FIG. 23 is a block diagram illustrating an optical linked semiconductor memory system 8400 according to certain embodiments. As illustrated, the memory system 8400 may include optical connection devices 8431 and 8432, a memory controller 8420, and a semiconductor memory device 8410. The semiconductor memory device 8410 is, for example, a DRAM.

The optical connection devices 8431 and 8432 interconnect the memory controller 8420 and the semiconductor memory device 8410. The memory controller 8420 includes a control unit 8421, a first transmitter 8422, and a first receiver 8423. The control unit 8421 transmits a first electrical signal SN1 to the first transmitter 8422. The first electrical signal SN1 may include a command, a clock signal, an address, and data transmitted to the semiconductor memory device 8410. The first transmitter 8422 includes an optical modulator E/O. The optical modulator E/O converts the first electrical signal SN1 into a first optical transmission signal OTP1EC and transmits the first optical transmission signal OTP1EC to the optical connection device 8431. The first optical transmission signal OTP1EC is transmitted to serial communication through the optical connection device 8431. The first receiver 8423 includes an optical demodulator O/E. The optical demodulator O/E converts a second optical reception signal OPT2OC received from the optical connection device 8430 into a second electrical signal SN2 and transmits the second electrical signal SN2 to the control unit 8420.

The semiconductor memory device 8410 includes a second receiver 8411, a cell array 8412, and a second transmitter 8413. The second receiver 8411 includes an optical demodulator O/E. The optical demodulator O/E converts the first optical reception signal OPT1OC from the optical connection device 8430 into the first electrical signal SN1 and transmits the first electrical signal SN1 to a cell array 8412.

In the cell array 8412, data written into a memory cell or data read from the cell array 8412 is transmitted to the second transmitter 8413 as the second electrical signal SN2 in response to the first electrical signal SN1. The second electrical signal SN2 may include a clock signal and read data transmitted to the memory controller 8420. The second transmitter 8413 includes an optical modulator E/O. The optical modulator E/O converts the second electrical signal SN2 into the second optical transmission signal OPT2EC and transmits the second optical transmission signal OPT2EC to the optical connection device 8432. The second optical transmission signal OTP2EC is transmitted to serial communication through the optical connection device 8432.

In FIG. 23, the DRAM 8410 may include a use time managing circuit 150 including a configuration such as shown in FIG. 2. Thus, use time of the DRAM 8410 may be monitored during the operation of the DRAM 8410. For example, generated adjusting information may be applied to each functional circuit to minimize or prevent occurrence of a field error. As a result, operation performance of the optical linked semiconductor memory system 8400 may be improved.

Figure 24:
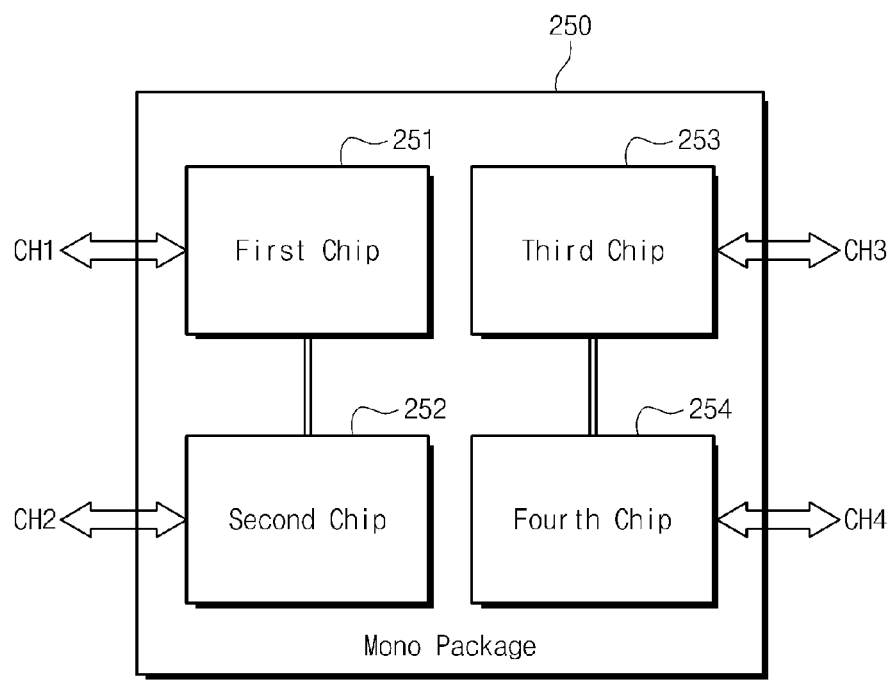
FIG. 24 is a block diagram illustrating a multi-channel semiconductor memory device according to certain embodiment.

FIG. 24 is a block diagram illustrating a multi-channel semiconductor memory device 250 according to certain embodiments. As illustrated, the multi-channel semiconductor memory device 250 may include four chips 251, 252, 253, and 254. The multi-channel semiconductor memory device 250 may be included in a mono package (e.g., a single package).

In one embodiment, the semiconductor memory device 250 may include two dies. As a result, two chips may be formed using a single die. In one embodiment, a first chip may be a first die manufactured on a wafer (e.g., on a first wafer) and a second chip may be a second die manufactured on the same wafer (e.g., on the first wafer) or a different wafer (e.g., on a second wafer). A die means an individual chip manufactured on a wafer. Before a plurality of dies are divided from a wafer, respective dies are manufactured at one time through various semiconductor manufacturing processes to constitute individual chips, respectively. An oxidation process, a photolithography process, a thin film formation process, an etch process or a chemical mechanical polishing (CMP) process may be one of the various semiconductor manufacturing processes.

A first interconnection is formed between the first chip 251 and the second chip 252, and a second interconnection is formed between the third chip 253 and the fourth chip 254.

In a mono package, the multi-channel semiconductor device 250 may include fourth channels.

Although the first chip 251 and the second chip 252 include two dies, they may perform the same data input/output operation as a two-channel semiconductor memory device manufactured on a mono die.

Although the third chip 253 and the fourth chip 254 also include two dies, they may perform the same data input/output operation as a two-channel semiconductor memory device manufactured on a mono die.

In FIG. 24, the multi-channel semiconductor device 250 may include a use time managing circuit 150 including a configuration such as shown in FIG. 2. Thus, use time may be cumulatively recorded during the operation of the multi-channel semiconductor device 250. For example, generated adjusting information may be applied to each functional circuit to minimize or prevent occurrence of a field error. As a result, operation performance of the multi-channel semiconductor device 250 may be improved.

While the present disclosure has been particularly shown and described with reference to exemplary embodiments thereof, the general inventive concept is not limited to the above-described embodiments. It will be understood by those of ordinary skill in the art that various changes and variations in form and details may be made therein without departing from the spirit and scope of the inventive concept as defined by the following claims.

What is claimed is:

1. A use time managing method of a semiconductor device, the method comprising:

(1) measuring an amount of accumulated operation time of the semiconductor device and when the amount is reached to a predetermined value, generating a unit storage activation signal;

(2) repeating step (1) to generate one or more additional unit storage activation signals, thereby generating a plurality of unit storage activation signals, wherein the predetermined values are different for each repeating step;

(3) storing data indicating each occurrence of generating the unit storage activation signals; and (4) detecting use time of the semiconductor device based on the cumulatively stored data.

2. The use time managing method as set forth in claim 1, further comprising:

generating adjusting information when the detected use time reaches a reference time value; and adjusting an operation for an internal circuit of the semiconductor device based on the adjusting information.

3. The use time managing method as set forth in claim 2, wherein adjusting the operation of the internal circuit includes changing an output voltage level of a voltage generator of the semiconductor device.

4. The use time managing method as set forth in claim 2, wherein adjusting the operation of the internal circuit includes changing an amount of delay time of internal signals of the semiconductor device.

5. The use time managing method as set forth in claim 2, wherein adjusting the operation of the internal circuit includes changing a driving capability of drivers of the semiconductor device.

6. The use time managing method as set forth in claim 2, wherein adjusting the operation of the internal circuit includes changing a sensing capability of a sense amplifier of the semiconductor device.

7. The use time managing method as set forth in claim 2, wherein the semiconductor device is a dynamic random access memory including a plurality of memory cells each including a single access transistor and a single storage capacitor.

8. The use time managing method as set forth in claim 1, wherein each of the plurality of unit storage activation signals is generated by counting a number of refresh commands.

9. The use time managing method as set forth in claim 1, wherein each of the plurality of unit storage activation signals is generated by dividing a clock signal, the clock signal being generated by a clock generator of the semiconductor device.

10. The use time managing method as set forth in claim 1, wherein the cumulatively storing data is performed by programming, for each occurrence the generated unit storage activation signals, one of an antifuse, e-fuse or a flash memory cell.

11. A use time managing method of a semiconductor device, comprising:

monitoring accumulated operation time of the semiconductor device by nonvolatilely updating cumulative use time of the semiconductor device in units of preset time periods during an operation of the semiconductor device;

wherein the cumulative use time is obtained by counting a number of auto-refresh commands and self-refresh commands.

12. The use time managing method as set forth in claim 11, further comprising:

cumulatively storing the use time of the semiconductor device by programming one of an antifuse, an e-fuse or a flash memory cell.

13. The use time managing method as set forth in claim 11, wherein adjusting the operation of an internal circuit of the semiconductor device includes changing at least one of a voltage level, an amount of delay time and a driving capability.

14. A semiconductor device comprising:

a measuring circuit configured to measure accumulated operation time of the semiconductor device by generating a plurality of storage activation signals, each corresponding to a predetermined amount of operation time of the semiconductor device;

a storage circuit configured to cumulatively store data indicating occurrences of the generated storage activation signals; and a read circuit configured to read the cumulatively stored data such that use time of the semiconductor device is detected, wherein the plurality of storage activation signals are generated by a frequency divider configured to divide a clock signal generated by a clock generator of the semiconductor device or by a counter configured to count a number of refresh commands, and wherein the number of refresh commands includes a number of auto-refresh commands and self-refresh commands.

15. The semiconductor device of claim 14, further comprising:

a control circuit configured to generate adjusting information when the detected use time reaches a reference time value, wherein a voltage level or an amount of delay time of an internal circuit of the semiconductor device is adjusted based on the adjusting information.

16. The semiconductor device of claim 14, wherein the storage circuit includes at least one of an antifuse, an e-fuse and a flash memory cell.

* * * * *